US00RE37082E

(19) United States
(12) Reissued Patent
Butera

(10) Patent Number: US RE37,082 E
(45) Date of Reissued Patent: Mar. 6, 2001

(54) RF TRANSISTOR PACKAGE WITH NICKEL OXIDE BARRIER

(75) Inventor: Gasper Butera, Blue Bell, PA (US)

(73) Assignee: STMicroelectronics, Inc., Carrollton, TX (US)

(21) Appl. No.: 08/227,424

(22) Filed: Apr. 14, 1994

Related U.S. Patent Documents

Reissue of:
(64) Patent No.: 5,105,260
Issued: Apr. 14, 1992
Appl. No.: 07/429,310
Filed: Oct. 31, 1989

(51) Int. Cl.[7] ..... H01L 23/02
(52) U.S. Cl. ..... 257/678; 257/689; 257/690; 257/704; 257/731; 257/723; 257/668
(58) Field of Search ..... 357/74, 69, 70, 357/81; 257/678, 689, 690, 693, 704, 706, 731, 723, 668

(56) References Cited

U.S. PATENT DOCUMENTS

| | | | |
|---|---|---|---|
| 3,364,400 | 1/1968 | Granberry | 317/235 |
| 3,489,956 | 1/1970 | Yanai et al. | 317/234 |
| 3,500,066 | 3/1970 | Pritchett | 307/235 |
| 3,626,259 | 12/1971 | Torrance et al. | 317/234 |
| 3,651,434 | 3/1972 | McGeough et al. | 333/84 |
| 3,753,056 | 8/1973 | Cooke | 317/234 |
| 3,801,882 | 4/1974 | Ward | 317/234 |
| 3,908,185 | 9/1975 | Martin | 357/74 |
| 3,936,864 | 2/1976 | Benjamin | 357/74 |
| 3,996,603 | 12/1976 | Smith | 357/86 |
| 3,999,142 | 12/1976 | Presser et al. | 330/31 |
| 4,161,740 | 7/1979 | Frey | 357/36 |
| 4,168,507 | 9/1979 | Yester | 357/51 |
| 4,261,764 | 4/1981 | Narayan | 357/70 |
| 4,517,584 | 5/1985 | Matsushita | 357/74 |
| 4,639,760 | 1/1987 | Granberg et al. | 357/74 |
| 4,649,416 | 3/1987 | Borkowski et al. | 357/74 |
| 4,788,627 | 11/1988 | Ehlert | 357/81 |
| 4,876,588 | 10/1989 | Miyamoto | 357/81 |

FOREIGN PATENT DOCUMENTS

| | | |
|---|---|---|
| 235504 | 9/1987 | (EP) . |
| 55111239 | 2/1982 | (JP) . |
| 57233813 | 7/1984 | (JP) . |
| 58176921 | 4/1985 | (JP) . |
| 58169652 | 8/1985 | (JP) . |
| 61231868 | 4/1988 | (JP) . |

*Primary Examiner*—Frank G. Font
*Assistant Examiner*—Reginald Ratiff
(74) *Attorney, Agent, or Firm*—Theodore E. Galanthay; Lisa K. Jorgenson; Renee M. Larson

(57) ABSTRACT

An improved transistor package with superior stability to wave soldering, having a nickel oxide barrier strip formed on the surface of the leads.

22 Claims, 1 Drawing Sheet

FIG. 1
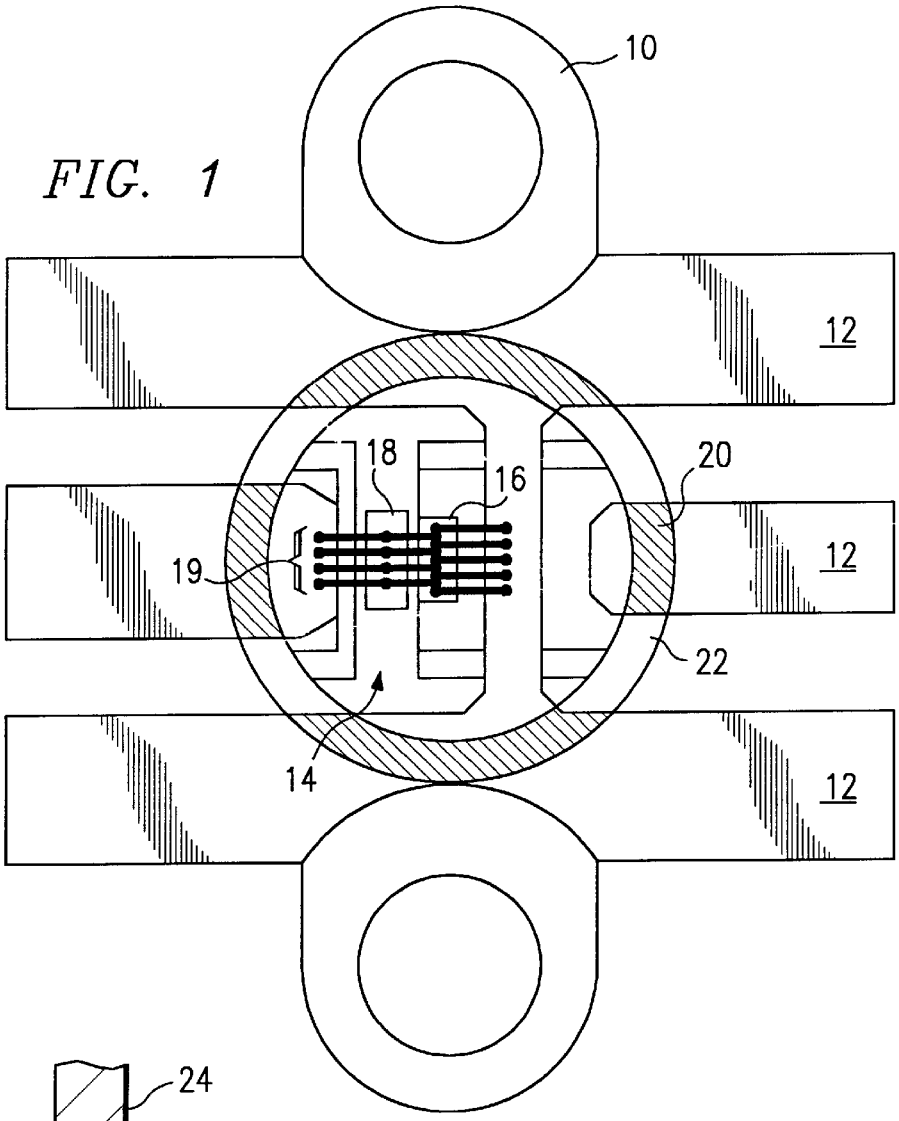
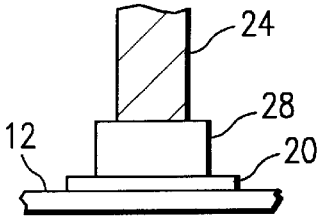
FIG. 3
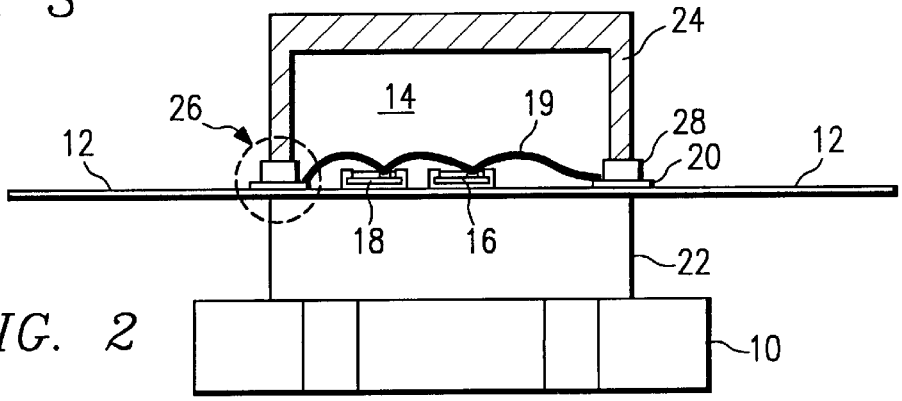
FIG. 2

RF TRANSISTOR PACKAGE WITH NICKEL OXIDE BARRIER

Matter enclosed in heavy brackets [ ] appears in the original patent but forms no part of this reissue specification; matter printed in italics indicates the additions made by reissue.

BACKGROUND OF THE INVENTION

1. Field of the Invention

This invention provides a novel package for RF transistors which offers improved stability to wave and vapor phase soldering.

2. Description of Related Art

Hybrid RF power, semiconductive devices, or packages, are well-known in the art. Typically such devices or packages include a transistor and an input capacitor mounted upon appropriately metallized surfaces of a beryllia substrate including a lead frame arrangement bonded to the metallized areas which includes input, output and ground portions or members. Appropriate wire bonds extend from the active portions of the transistor and capacitor to the various lead portions as is well understood. Such hybrid devices, or packages, may be characterized as having an input circuit and output circuit and a common circuit which includes common lead inductance.

The beryllia substrate is electrically insulating but thermally conducting and is usually mounted upon a relatively massive metallic heat sink. Appropriate ground connections may be made to the grounded heat sink. Further, the input and output circuits usually comprise microstrip conductor means which include a metallic strip mounted on an insulating substrate whose impedance are matched to those of the input and output circuits of the transistor. In addition, the microstrip circuit devices may also be grounded to the metallic heat sink, for example, by wrap around metallizations.

The RF transistor packages have protective caps sealed over the active silicon device with epoxy. Automated package assembly techniques, such as wave soldering and vapor phase soldering, employ temperatures and conditions which often cause breakdown of the epoxy and leakage of the solder into the active region of the device. In addition, when soldering onto a gold lead, the solder and solder flux may leach and travel along the gold underneath the epoxy. Equipment manufacturers must therefore rely on hand soldering of devices into boards after automatically inserting and soldering all other components.

There remains a need, then, for an improved package which will permit total automation of the assembly process.

SUMMARY OF THE INVENTION

An RF transistor package is provided, exhibiting superior stability to wave and vapor phase soldering. The improved device has a barrier of nickel oxide in proximity to, and encircling, the active region, thereby preventing solder from penetrating the epoxy/cap interface. This barrier is formed by placing a photoresist material over nickel or nickel-plated leads prior to gold plating. A narrow ring or annulus of nickel without gold plating then surrounds the active area. This unplated region is oxidized during assembly of the package, creating the nickel oxide barrier, and a cap sealed to the ring area with epoxy. The nickel oxide barrier resists migration of solder, thereby maintaining the integrity of the package.

BRIEF DESCRIPTION OF THE DRAWINGS

FIG. 1 is a top view of a typical package of this invention.

FIG. 2 is a side view of the package of FIG. 1.

FIG. 3 is an exploded view of the cap-to-lead junction shown in FIG. 2.

DETAILED DESCRIPTION OF THE INVENTION

In FIG. 1, a package of this invention without its cap is viewed from above. Copper flange 10 and gold-plated leads 12 perform usual mounting and connecting functions. The active region 14 contains transistor and capacitor dies 16 and 18 respectively, joined to each other, and the leads 12 with suitable connectors 19, usually gold wire. Nickel oxide barrier strips 20 on the leads are shown as forming segments of a ring surrounding the active area. The unshaded regions 22 of the ring are beryllia which will be covered with epoxy prior to attachment of the cap.

In FIG. 2, a representative package of the invention is shown from the side in outline form. Copper flange 10 acts as a mounting frame as well as a heat sink for the assembled device. Any thermally and electrically conductive material suitable for use as a base member may be substituted for the copper. The beryllium oxide pill support for the lead frame 12 and active area 14, including transistor die 16, capacitor die 18, and gold wire connectors 19. The pill is generally a thermally conducting, electrically insulating support with its lower surface coupled to the base member and the upper surface having a thin conductive coating.

The lead frame 12 is usually machined from kovar (iron/cobalt) or alloy 42 (nickel/iron). The base metal is then coated with a layer of nickel followed with a layer of gold. Typically, the plating layers are from about 130 to about 300 microinches thick. These gold plated leads are mounted on the pill and electrically connected to the transistor die 16, optionally to additional electronic devices, such as capacitors, which are also mounted on the pill. A ceramic cap 24 covers the active area 14. The ceramic cap is bonded to the pill and leads as shown in region 26 of FIG. 2. An epoxy preform 28 is sited on top of the nickel oxide strip 20. The nickel oxide strip is present on each lead and serves as a barrier to the migration of solder under the cap during wave soldering.

Referring now to FIG. 3, which is an exploded view of region 26 of FIG. 2, the ceramic cap 24 is mounted on the epoxy preform 28. The epoxy preform is in turn mounted on the nickel oxide strip 20 of gold-plated lead 12.

In this invention the gold-plated leads are not completely coated with gold, but have a narrow unplated region near the end proximate to the chip. The unplated region is made by masking the base metal lead during coating so that a narrow strip of nickel is left uncoated. This exposed strip is of sufficient width to accommodate the leading edges of the cap. During the mounting of the chip to the pill the exposed nickel of the leads is rapidly oxidized. Subsequently, the cap is epoxied over the nickel oxide strips.

In forming the leads of this invention, it is only necessary to prevent the gold plating from covering a region of the leads sufficiently wide to afford some barrier. This may be achieved via negative resist with a clear field mask or positive resist with a dark field mask. Preferably, the gold plating is conducted on leads which have already been brazed to a pill by conventional methods.

While several embodiments of the invention have been described in detail herein and illustrated in the accompanying drawings, further modifications of the invention will be obvious to one skilled in the art of package design. These further modifications and their equivalents are understood to be encompassed within the scope of the following claims.

What is claimed is:

1. A semiconductor device comprising in combination:

a thermally and electrically conducting base member;

a thermally conducting, electrically insulating support for a semiconductor die, said support having upper and lower surfaces, said lower surface coupled to said base member and said upper surface having a conductive coating thereon;

a semiconductor die mounted on and electrically coupled to said upper surface of said support;

a plurality of gold-plated leads mounted on said upper surface of said support and electrically connected to said semiconductor die, each of said leads having a nickel oxide barrier strip near the end of the lead proximate to the semiconductor die, said oxide barrier strip of a size and shape adapted to accept the leading edge of a protective cap; and a protective cap for the semiconductor die, said cap non-hermetically sealed by epoxy to the leads and the support at the nickel oxide barrier strip, said strip protecting said semiconductor die from contamination by solder.

2. A device of claim 1 in which the nickel oxide barrier strip width is greater than the wall thickness of the cap.

3. A device of claim 1 in which the cap is non-hermetically sealed to the support and leads with epoxy.

4. A device of claim 1 in which the semiconductor support is a beryllium oxide support.

5. A device of claim 1 in which the base member is formed from copper.

6. A device of claim 1 in which the gold-plated leads are selected from the group consisting of goldplated nickel, gold-plated kovar, and gold-plated alloy 42.

7. A semiconductor device comprising in combination, a copper flange;

a beryllium oxide pill having a thin gold coating mounted on said flange;

a transistor die mounted on the pill;

gold-plated leads mounted on said pill, said leads electrically connected to said transistor die, said leads having nickel oxide barrier strips near the ends of the leads proximate to the die; and a ceramic cap covering the die, the edges of said cap non-hermetically sealed by epoxy to the oxide barrier strips, said strips protecting said semiconductor die from contamination by solder.

*8. An electronic structure, comprising:*

*one or more electronic devices; and*

*leads, in a fixed spatial relationship to said devices, comprising a first metal covered by a layer of a second metal, said layer of second metal being predominantly, but not entirely, covered by a layer of gold;*

*at least some ones of said leads comprising a respective inner portion separated from a respective outer portion by a respective barrier portion on which said gold layer is absent, and an oxide of said second metal is present over said second metal;*

*multiple portions of said semiconductor devices each being electrically connected to a respective inner portion of a respective one of said leads.*

*9. The device of claim 8, wherein said multiple portions of said semiconductor devices are each wire-bonded to a respective inner portion of a respective one of said leads.*

*10. The device of claim 8, wherein said devices include both a capacitor and also a discrete transistor.*

*11. The device of claim 8, wherein said second metal is nickel.*

*12. The device of claim 8, wherein said first metal is Kovar.*

*13. An electronic structure, comprising:*

*one or more electronic devices;*

*a cap enclosing said electronic devices; and*

*leads, in a fixed spatial relationship to said devices, comprising a first metal covered by a layer of a second metal, said layer of second metal being predominantly, but not entirely, covered by a layer of gold;*

*at least some ones of said leads comprising a respective inner portion separated from a respective outer portion by a respective barrier portion on which said gold layer is absent, and an oxide of said second metal is present over said second metal;*

*said inner portions of said leads being inside said cap, said outer portions of said leads being outside said cap, and said cap being bonded to said barrier portions of said leads;*

*multiple portions of said semiconductor devices each being electrically connected to a respective inner portion of a respective one of said leads.*

*14. The device of claim 13, wherein said multiple portions of said semiconductor devices are each wire-bonded to a respective inner portion of a respective one of said leads.*

*15. The device of claim 13, wherein said devices include both a capacitor and also a discrete transistor.*

*16. The device of claim 13, wherein said second metal is nickel.*

*17. The device of claim 13, wherein said first metal is Kovar.*

*18. An electronic structure, comprising:*

*a dielectric substrate;*

*one or more electronic devices mechanically affixed to said substrate; and*

*a plurality of leads mechanically affixed to said substrate, and each comprising a first metal covered by a layer of a second metal, said layer of second metal being predominantly, but not entirely, covered by a layer of gold;*

*at least some ones of said leads comprising a respective inner portion separated from a respective outer portion by a respective barrier portion on which said gold layer is absent, and an oxide of said second metal is present over said second metal;*

*multiple portions of said semiconductor devices each being electrically connected to a respective inner portion of a respective one of said leads.*

*19. The device of claim 18, wherein said multiple portions of said semiconductor devices are each wire-bonded to a respective inner portion of a respective one of said leads.*

*20. The device of claim 18, wherein said devices include both a capacitor and also a discrete transistor.*

*21. The device of claim 18, wherein said second metal is nickel.*

*22. The device of claim 18, wherein said first metal is Kovar.*

* * * * *